United States Patent
Mendicino

(10) Patent No.: US 6,271,143 B1
(45) Date of Patent: Aug. 7, 2001

(54) METHOD FOR PREVENTING TRENCH FILL EROSION

(75) Inventor: Michael A. Mendicino, Austin, TX (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/306,029

(22) Filed: May 6, 1999

(51) Int. Cl.[7] .................................................. H01L 21/311
(52) U.S. Cl. ........................ 438/700; 438/745; 438/756; 438/757
(58) Field of Search ................................... 438/690, 692, 438/700, 706, 722, 723, 724, 745, 756, 757, 609, 747

(56) References Cited

U.S. PATENT DOCUMENTS

| | | | | |
|---|---|---|---|---|
| 4,576,834 | * | 3/1986 | Sobczak | 427/93 |
| 5,298,450 | * | 3/1994 | Verret | 437/67 |
| 5,410,176 | * | 4/1995 | Liou et al. | 257/50 |
| 5,652,176 | * | 7/1997 | Maniar et al. | 437/67 |
| 5,683,945 | * | 11/1997 | Penner et al. | 437/225 |
| 5,801,082 | * | 9/1998 | Tseng | 438/424 |
| 5,976,948 | * | 11/1999 | Werner et al. | 438/424 |
| 6,001,541 | * | 12/1999 | Iyer | 430/322 |
| 6,221,736 | * | 4/2001 | Gau | 438/435 |
| 6,225,165 | * | 5/2001 | Noble, Jr. et al. | 438/268 |

* cited by examiner

Primary Examiner—Benjamin L. Utech
Assistant Examiner—Charlotte A. Brown
(74) Attorney, Agent, or Firm—James L. Clingan, Jr.

(57) ABSTRACT

A trench (110) for isolation is formed in a substrate (102) through an opening in a nitride masking layer (106). After the trench is formed, the opening in the nitride masking layer is widened uniformly by an isotropic etch (FIG. 8). This leaves the nitride masking layer uniformly recessed from the edge of the trench. The trench is then filled with oxide and, with CMP, is etched back so that there is a nearly planar surface with oxide (114b) extending outside the trench wall along the surface and abutting the recessed nitride masking layer (106). The nitride masking layer is then removed so that there is left an oxide overlap portion (114b) which extends outside the trench wall. Subsequent oxide etches which are required for formation of transistors etch the oxide overlap portion instead of etching down into the oxide along the sidewall of the trench whereby an improved device is formed.

25 Claims, 5 Drawing Sheets

METHOD FOR PREVENTING TRENCH FILL EROSION

FIELD OF THE INVENTION

The present invention relates generally to semiconductor manufacturing, and more particularly to, reducing trench fill erosion in shallow trench isolation (STI) processing.

BACKGROUND OF THE INVENTION

In the integrated circuit (IC) industry, trench isolation is now being used to replace conventional local oxidation of silicon (LOCOS) in order to form improved field isolation structures. However, the dielectric material used to fill isolation trenches formed within a substrate may be substantially eroded during post-trench processing whereby adverse parasitic MOSFET devices are formed adjacent the active areas of an integrated circuit (IC). FIGS. 1–5 illustrate the parasitic MOSFET formation which occurs in a conventional shallow trench isolation (STI) integrated circuit (IC) process.

FIG. 1 illustrates a semiconductor trench structure 10. In FIG. 1, a semiconductor substrate or semiconductor wafer 12 is provided. A pad oxide or thermal oxide layer 14 is formed over the substrate 12. A thicker silicon nitride layer 16 is deposited on top of the thin oxide layer 14. Conventional photolithographic processing is used to etch an opening 18 through the silicon nitride layer 16 and the oxide layer 14 to expose a portion of the substrate 12. This opening in the dielectric layers 14 and 16 is then extended into the substrate by a silicon etch to form a shallow trench region 18. After formation of the shallow trench region 18, a thermal oxidation process is utilized to form a thin oxide liner layer 17 on both the sidewalls and the bottom surface of the trench 18 in FIG. 1.

FIG. 2 illustrates that a trench fill layer 20a is conformally deposited within the trench 18 after formation of the liner 17. Layer 20a is typically formed by depositing an insulator such as an oxide formed using ozonated tetraethylorthosilicate (TEOS) and is formed of a thickness greater than the trench depth plus the thickness of the silicon nitride layer 16. FIG. 2 illustrates a dashed line 19 within the layer 20a. Line 19 indicates a level to which the layer 20a will be subsequently polished to form a proper trench fill plug region using the silicon nitride layer 16 as a polish stop layer.

FIG. 3 illustrates the structure of FIG. 2 after chemical mechanical polishing (CMP) planarization of layer 20a has occurred. The CMP process forms a trench plug region 20b from the layer 20a illustrated previously in FIG. 2. As indicated in FIG. 3, a top surface 19 of the plug region 20b is roughly analogous to the dashed line 19 in FIG. 2. After CMP is complete, the silicon nitride layer 16, which is used as a CMP stop, is then removed by a wet etch process. After removal of the silicon nitride layer 16, at least one active area, indicated as active area 24, is defined at top surface of the substrate 12 in FIG. 3. Electrical devices are subsequently formed within the active area 24 of the substrate and interconnected by overlying conductive layers, not shown, to form a functional IC.

FIG. 4 illustrates the adverse erosion of the trench fill plug 20b which occurs from subsequent processing of the active area 24. After formation of the trench plug 20b in FIG. 3, the active area 24 is exposed to many etch processing steps and cleaning steps which will eventually erode the dielectric plug material 20b as these additional steps occur. It is known in the art that TEOS layers will etch in oxide etch environments faster than thermally grown oxide layers. This faster etch rate of TEOS when compared to thermal oxide (e.g., gate oxides and most sacrificial oxides) will further exacerbate the erosion of the plug region 20b compared to other IC regions since the trench plug 20b is typically made of TEOS. FIG. 4 illustrates a plug region 20c which is the plug region 20b (see FIG. 3) after being substantially eroded by subsequent semiconductor processing that is needed to make active circuitry in the region 24. As illustrated in FIG. 4, erosion of the plug to result in an eroded plug 20c forms an exposed sidewall 26 of the active silicon surface area 24. This sidewall area 26 is exposed to subsequent active area processing (e.g., gate oxide and gate polysilicon formation) whereby unwanted parasitic sidewall devices (e.g., an unwanted sidewall parasitic MOSFET) are formed on the sidewall 26 of the active area 24.

FIG. 5 illustrates a three-dimensional cross-sectional perspective of the device of FIG. 4. FIG. 5 illustrates the top surface of the active area 24 of FIG. 4 as well as the parasitic sidewall 26 which is adversely formed by trench plug erosion. FIG. 5 illustrates that a MOSFET source region 28 and a MOSFET drain region 30 are formed within the active area by conventional ion implantation and thermal activation. These source and drain region 28 and 30 are separated by a channel region 32 within the active area 24. As is known in the art, a gate dielectric layer (not specifically shown in FIG. 5) is formed over the channel region 32 and a conductive gate electrode (not specifically shown in FIG. 5) is then formed overlying this gate oxide and overlying the channel region 32. The gate electrode is used to control a conductivity of the channel region 32 between the current electrode regions 28 and 30 in FIG. 5.

The fact that the resulting structure in FIG. 5 is not planar results in several problems. In gate formation, typically a blanket polysilicon layer is deposited and selectively etched to leave the gate electrodes in the desired locations. Thus, there is polysilicon over the trench isolation areas, such as 20c, which must be removed. The polysilicon present in and over the cavity adjacent to sidewall 26, is thicker than the polysilicon over the planar areas where the gates are to be established. Thus, when the polysilicon is etched it is completely removed in the areas adjacent to the gates before it is removed from the cavity adjacent to sidewall 26. To remove this polysilicon in this cavity requires substantial overetching which will slowly etch the gate oxide adjacent to the gates. If this overetch is applied too long it will etch through this gate oxide and pit the substrate such as substrate 12 adjacent to the gates. If this occurs, the transistor adjacent to this pit is likely to fail because of a reduction in the gate oxide integrity. If this overetch is not applied long enough, the polysilicon is not completely removed from the cavity which results in electrical shorts across the trench isolation. This is commonly called polysilicon stringers. Thus, there is a critical range of overetching which, if violated in either being too long or too short, will cause a serious problem. The critical range of overetching becomes smaller and smaller as the technology scales down, particularly as gate oxide thickness reduces.

Additionally, due to the erosion present in the trench plug region 20c, a parasitic MOSFET sidewall channel region 34 is present in the structure of FIG. 5 once the gate electrode is formed. Due to the fact that parasitic channel region 34 will be exposed to gate oxide formation and lie adjacent a portion of a subsequently formed gate electrode, the channel region 34 is a parasitic transistor channel region which is formed between the electrodes 28 and 30 in parallel to the desired channel region 32. Due to the fact that threshold (Vt) adjust implants, well region doping profiles, and other implanted regions are formed in the substrate, doping concentrations of dopant atoms in the substrate is not constant throughout the depth of a semiconductor substrate 12. Therefore, the threshold voltage of the vertical sidewall 34 may be substantially different from a threshold voltage of the top channel region 32 which will have a substantially constant dopant across its surface due to the fact that it in not directed into the depth of the substrate as is channel region 34. Typically, a doping concentration of the region 34 integrated over the vertical sidewall will be less or more than a doping concentration at the active area surface 32. Therefore, the parasitic channel region 34 is likely to typically "turn on" and form a conductive inversion region (i.e., an unwanted parasitic leakage path) between the regions 28 and 30 before the actual transistor channel region 32 is "turned-on" creating undesirable MOSFET behavior. If the sidewall of the channel region 34 of FIG. 5 is deep, the likelihood of forming adverse polysilicon stringers when patterning polysilicon gate electrodes also increases. Therefore, this parasitic channel region 34 is disadvantageous altogether.

One way to reduce the adverse erosion of the trench region 20c as illustrated in FIG. 5 is to expose the trench region 20c to fewer etch environments. The prior art has attempted to reduce the amount of wet etching and reactive ion etching (RIE) of the trench fill material 20c by reducing the amount of processing in the active area 24. However, for each etch and/or clean process removed from the overall semiconductor flow, the active area 24 is not being fully or adequately processed in accordance with general IC processing standards. As a result, integrated circuit (IC) yield in the active area and/or IC performance may be adversely impacted due to reduced cleaning processing and reduced etch processing.

Another solution attempted in the prior art is to form the liner 17 of FIG. 1 from a silicon nitride layer or a silicon oxynitride layer. This silicon nitride liner 17 will not etch substantially in oxide/TEOS etch environments and will not etch substantially in substrate cleaning processes. Therefore, through use of this nitrided liner, the sidewall erosion of the trench fill material 20c should be reduced by the sidewall presence of silicon nitride or oxynitride 17. However, silicon nitride (in contact with a Si substrate) has been shown to cause stress induced defects near the active area which adversely impacts MOSFET devices. Furthermore, any deposition of additional material within the trench may change the aspect ratio of the trench opening 18 thereby adversely affecting subsequent deposition processing and trench filling.

In addition, the presence of both exposed oxide surfaces and exposed nitride surfaces when forming the trench layer 20a in FIG. 2 adversely affects the conformality and selectivity of the TEOS deposition process of FIG. 2. Also, silicon nitride and some nitrided oxides has a greater permitivity ($\in$) or dielectric constant whereby the capacitive coupling to the parasitic sidewall region 34 may actually be increased by using a nitrided film thereby exacerbating the problems discussed herein. Nitride layers also reduce subsequent oxidation of any exposed sidewall wherein it may be impossible to advantageously thicken a parasitic gate dielectric laterally adjacent an exposed sidewall channel region 34 via thermal oxide growth or the like. Therefore, the increased complexity and risk from using a nitride or nitrided trench fill liner is not always advantageous.

In another embodiment, polysilicon may be deposited within the trench 18 formed in FIG. 1 whereby this polysilicon can be thermally oxidized to form a polysilicon-oxide liner 17 in the hope of reducing sidewall erosion of the region 20c. Note that polysilicon-oxide is similar to thermal oxide in that it etches slower than TEOS which could reduce overall trench erosion over time. However, this process adds at least one other process step to the process flow (e.g., it adds at least the additional step of the deposition of the polysilicon), and may decrease a lateral dimension of the trench whereby filling of the trench via subsequent dielectric deposition processing is more complicated.

Therefore, a need exists in the industry for a trench fill process which reduces trench plug erosion of the plug 20c thereby eliminating or reducing the adverse device affects of the parasitic sidewall, poly stringers, and pitting the substrate without significantly complicating the process flow.

Figure 1:
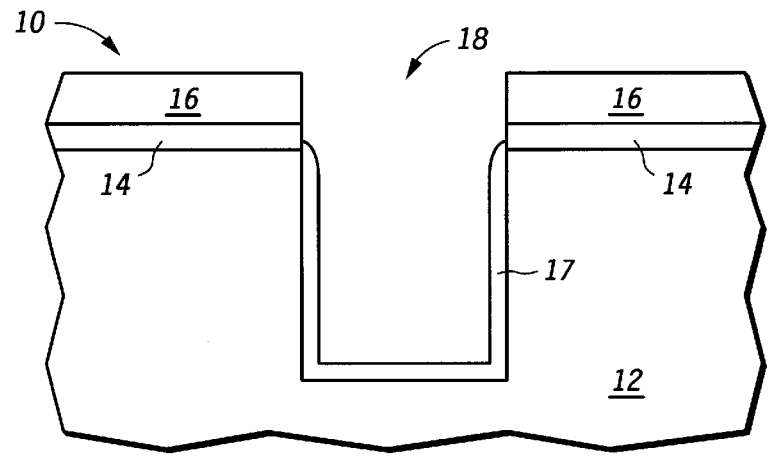
FIGS. 1–5 illustrate, in cross-sectional diagrams, a prior art trench fill process which results in substantial trench fill erosion which creates disadvantageous parasitic sidewall structures, potential polysilicon stringers, and/or substrate pitting.
Figure 2:
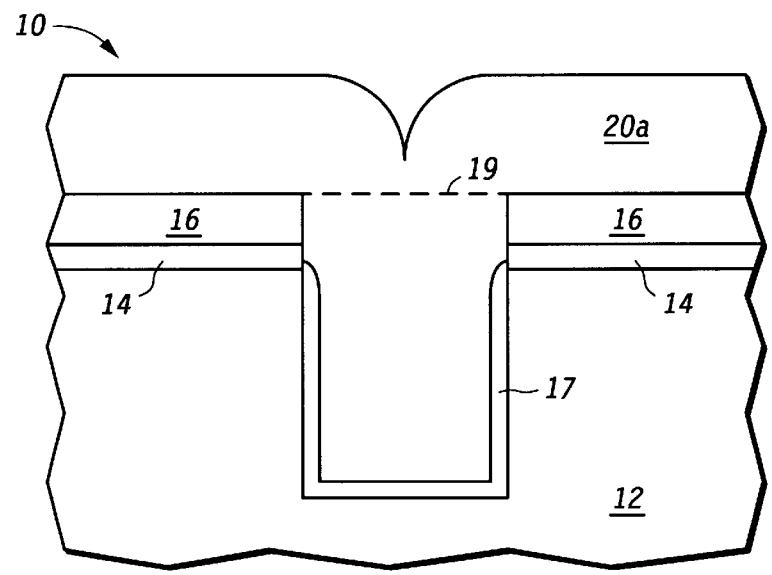
Figure 3:
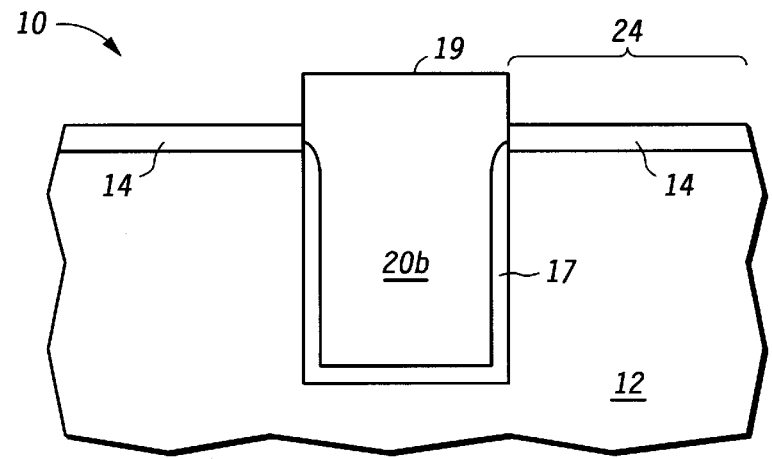
Figure 4:
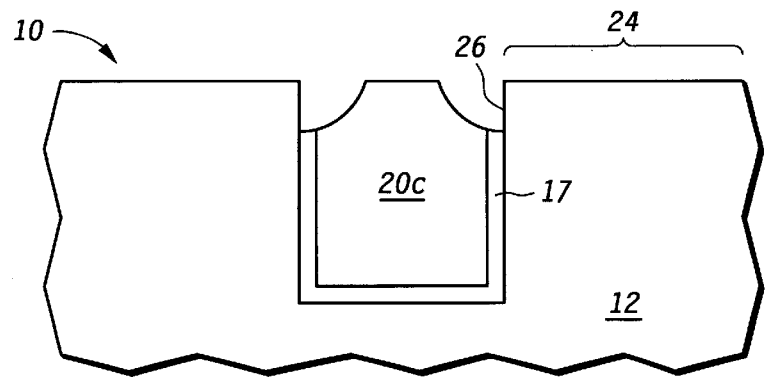

It will be appreciated that for simplicity and clarity of illustration, elements illustrated in the drawings have not necessarily been drawn to scale. For example, the dimensions of some of the elements are exaggerated relative to other elements for clarity. Further, where considered appropriate, reference numerals have been repeated among the drawings to indicate corresponding or analogous elements.

Description of the Invention

Generally, the FIGS. 6–13 illustrate a method for forming a trench isolation region that has an improved cross-sectional shape. The improved cross-sectional shape is created by isotropically etching a nitride masking layer that overlies the substrate trench regions in order to form laterally recessed regions. Filling both the laterally recess regions and the substrate trench opening with a dielectric trench fill results in a trench cross-sectional "T" shape. This "T" shape improves IC surface uniformity, reduces or eliminates the formation of unwanted polysilicon stringers, reduces sidewall parasitic effects, and/or reduces the occurrence of substrate pitting in a manner that is improved over that available in the prior art.

The invention may be further understood with specific reference to FIGS. 6–13 hereinbelow.

Figure 6:
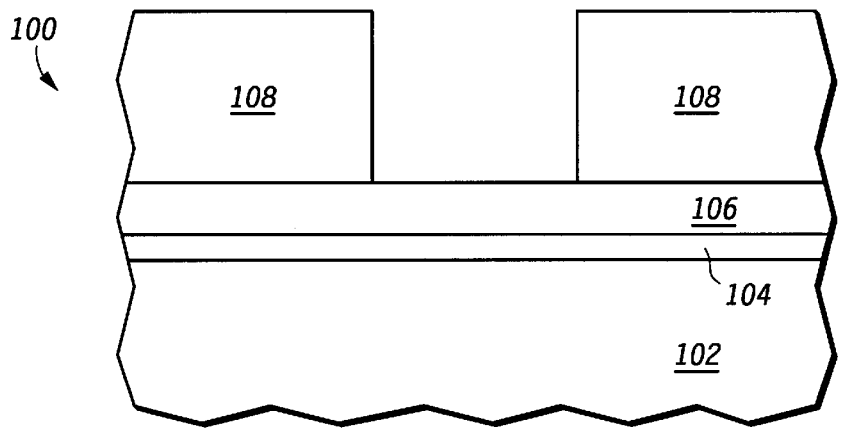
FIGS. 6–13 illustrate, in cross-sectional diagrams, an improved trench fill process which reduces or eliminate, adverse trench fill erosion in accordance with the present invention.

Shown in FIG. 6 is an integrated circuit (IC) 100 comprising a substrate 102, an oxide layer 104, a nitride layer 106 and a photoresist layer 108 which has a portion selectively removed. The substrate 102 is any material or viable IC substrate such as silicon, silicon germanium, germanium, gallium arsenide, other III–V compounds, silicon carbide, silicon on insulator (SOI) substrates, epitaxial regions, hybrid substrates (wherein portions of the substrate are silicon on insulator regions and other are bulk silicon regions), and the like. The oxide is preferably a thin thermally grown oxide having a thickness of roughly 100 Angstroms to 300 Angstroms with 150 Angstroms being preferred. The nitride layer is either silicon nitride, silicon oxynitride, silicon rich variants thereof, or composites any of these materials. The general thickness of the layer 106 is in the range of roughly 500 Angstroms to 2,500 Angstroms with 1,000–1,500 Angstroms being typical. In an alternate embodiment, the layer 106 may be capped with a thin protective layer, such as polysilicon or oxide. This protective layer (not specifically shown in FIG. 6) may be used to prevent top portions of layer 106 from eroding during lateral recessing operations shown in FIG. 8. Such prevention of top surface erosion of layer 106 is desirable if the layer 106 is used an antireflective coating (ARC) layer for subsequent lithographic operations.

The area where the photoresist 108 has been selectively removed is an area where a trench isolation structure is to be formed. This layer 106 is to function as a chemical mechanical polishing (CMP) stop layer. In addition, the layer 106 may be an etch stop layer when etching an opening through the optional protective layer discussed above. Other suitable CMP stop layers may be used in lieu of the layer 106 shown in FIG. 6. Oxide layer 104 is generally a stress relief layer between the nitride layer 106 and the substrate 102. Layer 104 is useful for reducing the stresses that would typically occur between the nitride layer 106 and a silicon substrate 102. Other suitable stress reducing interlayers may be used as a layer 104 in FIG. 1 such as deposited dielectric layers and/or composites of deposited dielectric and thermally grown oxides.

Figure 7:
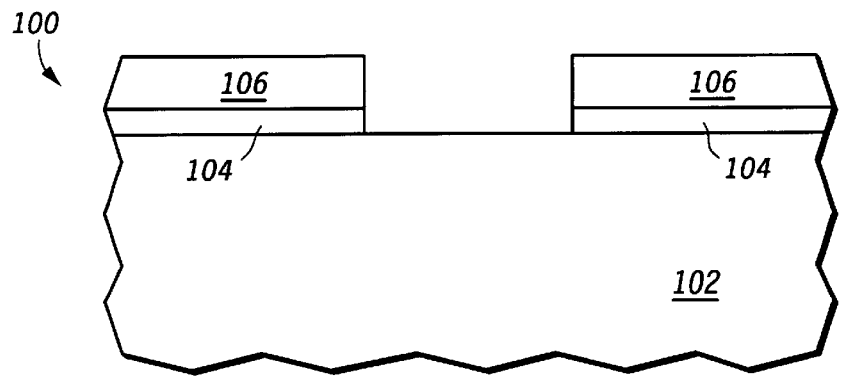

After formation of the opening through the photoresist 108 in FIG. 6, FIG. 7 illustrates that the opening through the photoresist is extended through the nitride layer 106 and the oxide layer 104 by a combination of a nitride/oxide reactive ion etch (RIE) or like composite selective plasma operation. In another form, a nonselective etch may be used to trench through all or several of the layers 102, 104, and 106.

Figure 8:
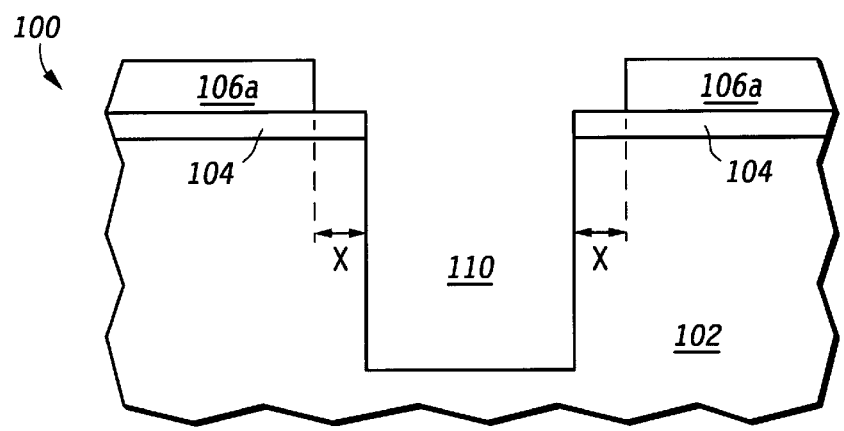

After etching of the layers 104 and 106, FIG. 8 illustrates that a trench isolation region 110 is formed using the layer 106 as a hard mask layer. After region 110 has been formed by etching into substrate 102, an isotropic or wet etch is performed, using an etchant such as phosphoric acid, where this etch laterally recesses layer 106 by an amount shown in FIG. 8 as X. In addition to recessing a sidewall of layer 106 to form the recessed layer 106a, a top portion of the layer 106 that is roughly of a thickness X is also removed from the device 100. This self-aligned lateral etch of layer 106 results in layer 106a being symmetrical so that the amount recessed from trench isolation region 110 is the same in all directions. Note that sidewall recession can be performed with a protective layer overlying layer 106 whereby layer 106a is formed in FIG. 8 without top surface erosion.

Figure 9:
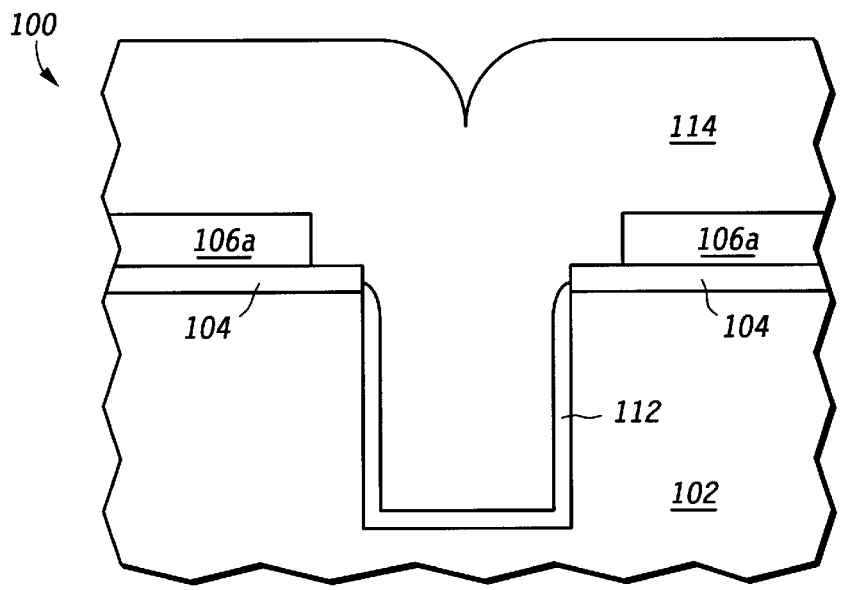

In FIG. 9, an oxide liner 112 is formed along the side walls of trench isolation region 110 either before or after erosion of the layer 106 by an isotropic etch. The layer 112 is typically formed by thermal oxidation but may be formed by physical vapor deposition (PVD), chemical vapor deposition (CVD) or a combination thereof. A typical thickness of layer 112 is on the order of less than 400 Angstroms with less than 150 Angstrom being desired for some applications. After formation of oxide liner 112, trench isolation region 110 is filled with a trench fill material. Generally, the trench fill material is a dielectric material or composite. A trench fill material such as an ozonated ($O_3$) TOES layer is typical. The deposited ozonated TOES oxide is generally deposited as a thick layer and may contain some air voids or keyholes in the trench opening 110. Typically, thicknesses of layer 114 range from 4,000 Angstroms to 10,000 Angstroms, however, such thicknesses are generally a function of the geometry of the trench region 110. and The trench fill layer 114 completely covers layers 106 and 104 by a significant amount, and fills the trench region 110 and the recessed portions of the layer 106. Layer 114 may be further densified by annealing. This is typically performed to reduce the etch rate of 114 to a value more similar to that of thermal oxide.

Figure 10:
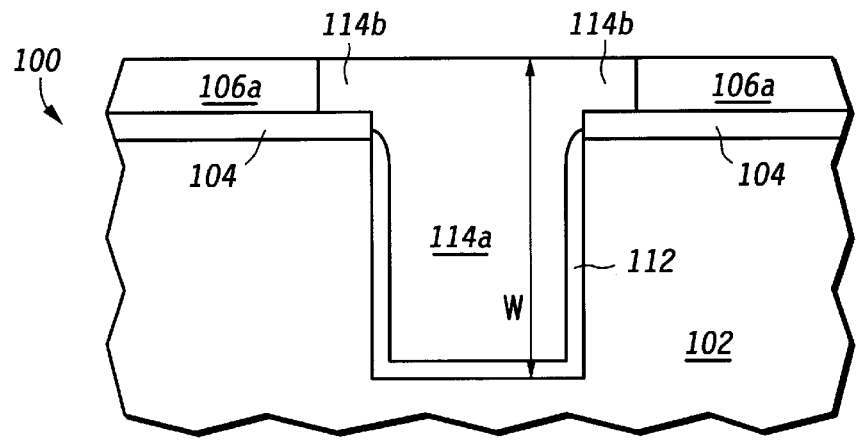

After layer 114 has been deposited, layer 114 is etched back by chemical etch processes, a resist etch back (REB) process, thermal reflow, and/or a CMP process to result in the "T" shaped trench plug region 114 shown in FIG. 10. A planar surface results as shown with regions 114B being co-planar and adjacent to layer 106a. The height or the distance from the bottom of trench isolation region 110 to the planar surface is shown in FIG. 10 as distance W. However, in practice it may be somewhat recessed below layer 106a because of the chemical aspect of the polishing process.

Figure 11:
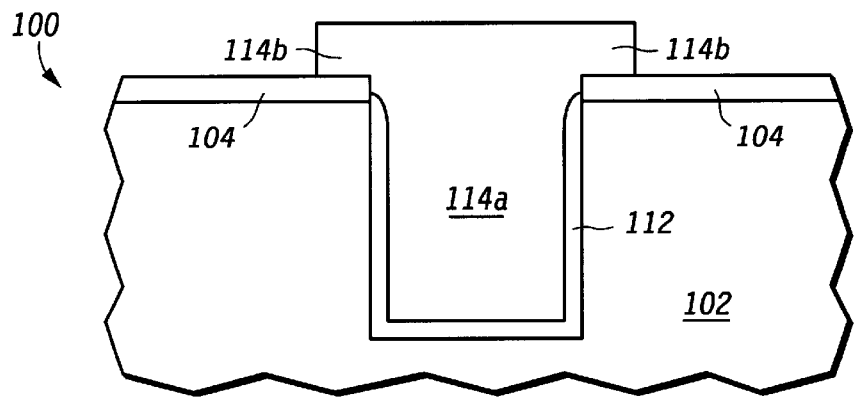

After polishing of the layer 114 to form trench plug 114a of FIG. 10, FIG. 11 illustrates that the layer 106a is removed by a wet or isotropic etch. Thus, as shown in FIG. 11, trench fill 114 includes portions 114b which extend past the side wall of trench isolation region 110 by a lateral amount X as shown in FIG. 9. The selective removal of the nitride layer 106 may result in some erosion of the regions 114b and/or 114a. However, unlike the prior art FIGS. 1–5, the presence of the lateral extension regions 14b prevents the erosion of the trench fill material from causing the problems observed in the prior art (e.g., stringer formation, parasitic sidewall devices, silicon pitting due to the need to over-etch, etc.).

With trench isolation virtually complete active devices can begin to be formed in the area adjacent to trench isolation region 110. The formation of these may require the formation and wet etch removal of sacrificial layers, the wet cleaning of the substrate surface, sputtering of material, or the like. These removal process may erode the trench fill material, but the presence of the region 114b will prevent such erosion from being problematic as in the prior art. As an example, when layer 104 is removed to form active devices in regions 120a and 120b of FIG. 12, layer 104 is an oxide and 114b is an oxide. Therefore, these two layers etch at nearly the same rates whereby the trench fill material is being eroded. However, region 114b adequately compensates for erosion whereby yield and device performance is enhanced.

Figure 12:
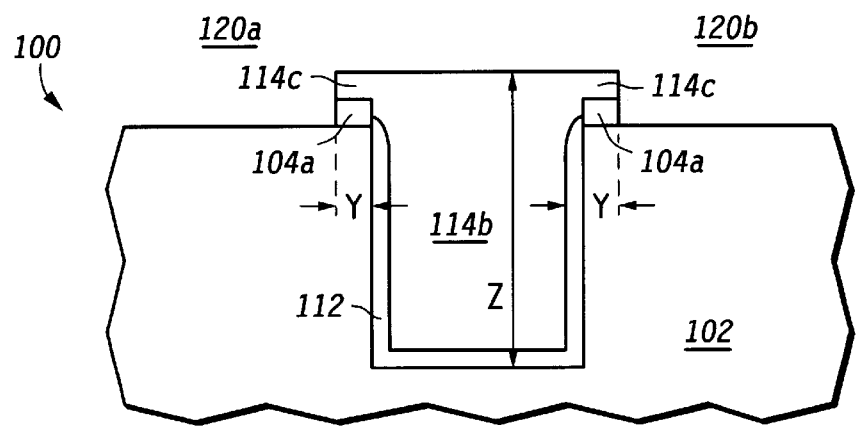
Figure 13:
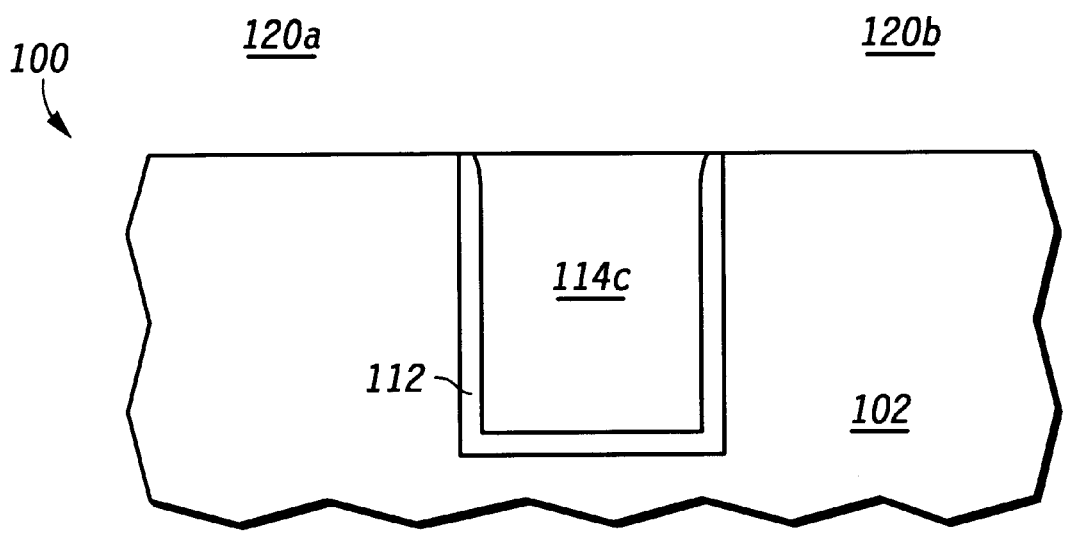

In FIG. 13, an isotropic etch is performed on layer 104 so that layer 104 is completely removed except in the area under 114b. Therefore, oxide regions 104a are formed by the wet etch removal of layer 104. Due to this etch of layer 104, region 114b and a top surface of region 114a are also reduced in dimension as well. FIG. 13 illustrates that the dimension X from FIG. 8 is reduced to a dimension Y shown in FIG. 12. Further, FIG. 12 shows that the thickness W of FIG. 10 is reduced to a thickness Z. With active area portions of the substrate 102 now exposed, surface cleaning, sacrificial oxide processing, dual gate oxide (DGO) formation in different active areas, and subsequent polysilicon gate electrode depositions for floating gate devices and logic device on the same IC can be performed. DGO devices are ICs that have an active region adjacent a first side of the trench region that contains a device with a gate oxide of less than or equal to 25 Angstroms in thickness while an active region adjacent a first side of the trench region is formed to contain a device that has a gate oxide of greater than or equal to 50 Angstroms in thickness. Due to surface preparation for active devices, the regions 114b and a top portion of the region 114a will be slowly eroded away. The desired result is shown in FIG. 13 where a completely planar surface results for substrate 102 so that the area above trench isolation region 110 is co-planar with that of substrate 102. The actual transistors that are formed and subsequent polysilicon and metal layers for interconnect are not shown in this figure but would follow from FIG. 13.

Figure 5:
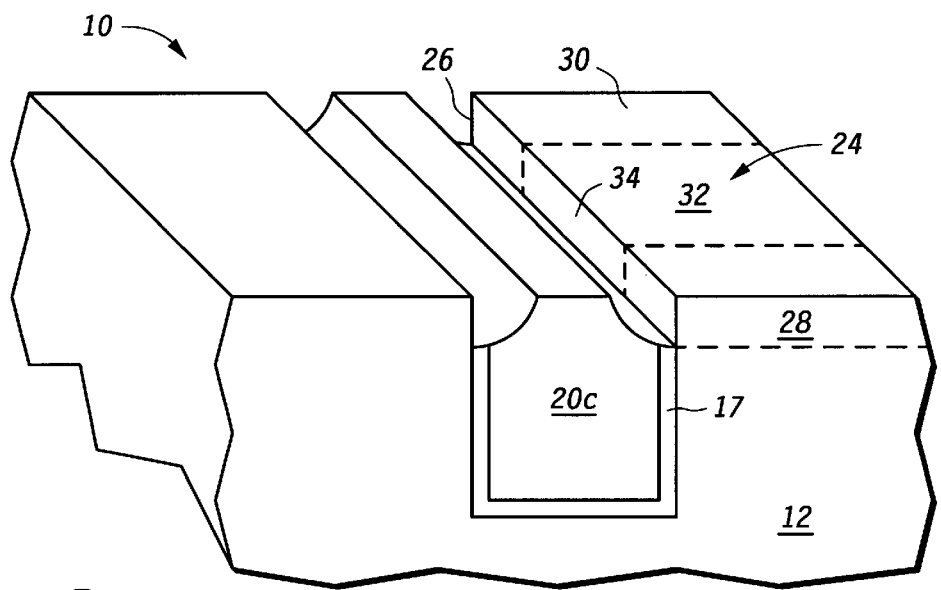

The isotropic etch which results in the structure shown in FIG. 8 is intended to recess nitride layer 108 by an amount X which is an amount that can be controlled quite consistently. The amount X that is chosen is dependent upon the subsequent etchings and wet surface cleanings that occur in active areas around the trench isolation area 110. When the oxide has been removed laterally from over region 110, the etch begins to progress adversely downward to leave a cavity in the trench as shown in FIG. 5. So the intent of FIGS. 6–13 is to provide a distance X so that the oxide eroded from the active area processing minimizes exposure of the sidewall of the substrate trench as in FIGS. 4–5. That is to say X is chosen so that the subsequent etches and cleans of active areas will remove material 114b of FIG. 11 over time such that an eroded region 114c of FIG. 12 is eventually formed. Then, the material 114c may be further eroded to result in complete removal of lateral oxide over the active areas as shown in FIG. 13, without any trench sidewall erosion shown in FIGS. 4–5. The thickness of the oxide is roughly equal to the amount X (i.e., thickness of region 114b=width X) so that these oxide etches which are performed remove laterally and from the top so that the resulting structure is nearly planar as shown in FIG. 13. Therefore, the process of FIGS. 6–13 forms an IC device that avoids the problem of poly stringers and avoids the problem of having to risk an overetch which could pit the substrate. The process taught herein also alleviates the problem of the parasitic MOS effect discussed with respect to FIG. 5.

While the present invention has been illustrated and described with reference to specific embodiments, further modifications and improvements will occur to those skilled in the art. It is to be understood, therefore, that this invention is not limited to the particular illustrations and that it is intended in the appended claims to cover all modifications that do not depart from the spirit and scope of this invention.

What is claimed is:

1. A method for forming a semiconductor device, the method comprising the steps of:

providing a substrate;

forming a masking layer over the substrate, the masking layer having an opening that exposes a portion of the substrate, the opening defining a sidewall of the masking layer;

etching a trench region within the portion of the substrate that is exposed by the masking layer so that a sidewall of the trench region is substantially aligned with the sidewall of the masking layer;

recessing the sidewall of the masking layer relative to the sidewall of the trench region to form a recessed region;

filling the trench region and the recessed region with a trench fill material; and removing a top portion of the trench fill material to form a trench isolation region, wherein trench fill material remains within the trench region and the recessed regions.

2. The method of claim 1 wherein the step of forming the masking layer comprises:

forming the masking layer as a layer that comprises at least one of either silicon nitride, silicon-rich silicon nitride, silicon-rich silicon oxynitride, or silicon oxynitride.

3. The method of claim 1 wherein the step of recessing the sidewall of the masking layer comprises:

recessing the sidewall of the masking layer along with a top surface of the masking layer by exposing both the sidewall of the masking layer and the top surface of the masking layer to a wet etch chemistry.

4. The method of claim 1 wherein a protection layer is formed over a top surface of the masking layer before the step of recessing is performed wherein the step of recessing the sidewall of the masking layer comprises:

exposing the sidewall of the masking layer to a wet etch chemistry where the protection layer substantially prevents removal of material from the top surface of the masking layer while portions of the sidewall of the masking layer are recessed.

5. The method of claim 1 wherein the step of recessing the sidewall of the masking layer comprises:

using a wet etch chemistry that comprises phosphoric acid.

6. The method of claim 1 further comprising the step of:

forming a dielectric layer under the masking layer between the masking layer and the substrate.

7. The method of claim 1 wherein the step of providing the substrate further comprises:

providing the substrate as a semiconductor on insulator (SOI) substrate that contains a buried oxide layer wherein the trench region stops on the buried oxide layer.

8. The method of claim 1 further comprising the step of:

forming a dielectric liner layer over a surface of the trench region before performing the step of recessing the masking layer.

9. The method of claim 1 further comprising the step of:

forming a dielectric liner layer over a surface of the trench region after performing the step of recessing the masking layer.

10. The method of claim 1 wherein the step of recessing the sidewall of the masking layer comprises:

recessing the sidewall in a self-aligned manner wherein a width of the recessed region on a first side of the trench is substantially equal to a width of the recessed region on a second side of the trench.

11. The method of claim 1 further comprising the steps of:

forming a gate oxide over a substrate region that is adjacent to the trench region wherein the gate oxide has a thickness of less than or equal to 25 angstroms;

forming a trench dielectric liner layer within the trench region wherein the trench dielectric liner layer is less than or equal to 150 angstroms in thickness; and forming the trench region so that a width of the trench region is less than or equal to 0.18 microns.

12. The method of claim 1 further comprising the steps of:

forming a logic device laterally adjacent a first side of the trench region; and forming a floating gate memory device adjacent a second side of the trench region.

13. The method of claim 1 wherein the step of filling the trench region comprises:

filling the trench region with an ozone TEOS layer.

14. The method of claim 1 wherein the masking layer is used as an etch stop for an etch operation, a polish stop for a chemical mechanical polishing (CMP) operation, and as an antireflective coating (ARC) layer for a lithographic operation.

15. The method of claim 1 wherein trench fill material that fills the recessed regions is eroded over time by one or more operations performed on the substrate, the operations being selected from a group consisting of: a masking layer etch step; a sacrificial oxide process; or a surface cleaning operation.

16. A method for forming a semiconductor device, the method comprising the steps of:

providing a substrate comprising silicon;

forming a pad oxide layer over the substrate;

forming a masking layer comprising nitrogen over the pad oxide later;

forming an opening through the pad oxide layer, the masking layer, and the substrate to form a trench region within the substrate;

recessing a sidewall portion and a top portion of the masking layer to form a recessed region spaced away from and around a top portion of the trench region;

filling the trench region, including the recessed region, with a dielectric material;

polishing the dielectric material to planarize a top portion of the dielectric material, the polishing leaving planarized dielectric material within the trench region and the recessed region.

17. The method of claim 16 further comprising the steps of:

forming a gate oxide over a substrate region that is adjacent to the trench region wherein the gate oxide is of a thickness of less than or equal to roughly 25 angstroms;

forming a trench dielectric liner layer within the trench region wherein the trench dielectric liner layer is less than or equal to 150 angstroms in thickness; and forming the trench region so that a width of the trench region is less than or equal to 0.18 microns.

18. The method of claim 16 further comprising the steps of:

forming a logic device laterally adjacent a first side of the trench region; and forming a floating gate memory device adjacent a second side of the trench region.

19. The method of claim 16 wherein trench fill material that fills the recessed regions are eroded over time by one or more operations performed on the substrate, the operations being selected from a group consisting of: a nitride etch step; a sacrificial oxide process; or a surface cleaning operation.

20. A method for forming a semiconductor device, the method comprising the steps of:

providing a silicon-based substrate;

forming a pad oxide layer over the substrate;

forming a masking layer comprising nitrogen over the pad oxide layer;

forming a protection layer over the masking layer;

forming an opening through the pad oxide layer, the masking layer, the protection layer, and the substrate to form a trench region in the substrate, the trench region region having a sidewall;

recessing a sidewall portion of the masking layer to form a recessed region in the masking layer, wherein the recessed region has a sidewall spaced from the sidewall of the trench region and wherein a top portion of the masking layer is substantially protected from removal by the presence of the protection layer;

filling the trench region, including the recessed region, with a dielectric material;

polishing the dielectric material to planarize a top portion of the dielectric material while leaving dielectric material within the trench region and the recessed region.

21. The method of claim 20 further comprising the steps of:

removing the protection layer by a chemical etch process after performing the step of recessing.

22. The method of claim 20 further comprising the steps of:

removing the protection layer by a chemical mechanical polishing (CMP) process after performing the step of recessing.

23. A method for forming a trench in a substrate, the method comprising the steps of:

forming a masking layer over the substrate;

forming an opening in the masking layer to form a patterned masking layer;

etching a trench region in the substrate having a sidewall aligned to the opening;

isotropically etching the patterned masking layer to recess the opening relative to the sidewall of the trench region; and filling the trench region and the opening after the patterned masking layer has been isotropically etched.

24. The method of claim 23 wherein the substrate is a hybrid substrate wherein portions of the substrate are silicon on insulator regions and other are bulk silicon regions.

25. The method of claim 23 wherein an active region adjacent a first side of the trench region is formed to contain a device that has a gate oxide of less than or equal to 25 Angstroms in thickness while an active region adjacent a first side of the trench region is formed to contain a device that has a gate oxide of greater than or equal to 50 Angstroms.

* * * * *

UNITED STATES PATENT AND TRADEMARK OFFICE
CERTIFICATE OF CORRECTION

PATENT NO.          : 6,271,143 B1
APPLICATION NO.  : 09/306029
DATED                   : August 7, 2001
INVENTOR(S)         : Michael A. Mendicino It is certified that error appears in the above-identified patent and that said Letters Patent is hereby corrected as shown below:

In Column 5, Line 59:

Change "TOES" to --TEOS--

In Column 5, Line 60:

Change "TOES" to --TEOS--

In Column 6, Line 23:

Change "14b" to --114b--

In Column 6, Line 59:

Change "first" to --second--

In Column 7, Line 4:

Change "108" to --106--

Signed and Sealed this

Fifth Day of June, 2007

JON W. DUDAS
*Director of the United States Patent and Trademark Office*